(12) United States Patent
Park

(10) Patent No.: US 9,119,298 B2
(45) Date of Patent: Aug. 25, 2015

(54) DISPLAY DEVICE

(71) Applicant: Samsung Display Co., Ltd., Yongin, Gyeonggi-Do (KR)

(72) Inventor: Hyun-Sang Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/146,541

(22) Filed: Jan. 2, 2014

(65) Prior Publication Data

US 2014/0198465 A1 Jul. 17, 2014

(30) Foreign Application Priority Data

Jan. 14, 2013 (KR) .......................... 10-2013-0003867

(51) Int. Cl.
| | |
|---|---|
| H05K 5/00 | (2006.01) |
| H05K 7/00 | (2006.01) |
| H05K 5/02 | (2006.01) |
| G09F 9/00 | (2006.01) |
| G06F 1/16 | (2006.01) |
| G09F 9/30 | (2006.01) |

(52) U.S. Cl.
CPC ............ *H05K 5/0226* (2013.01); *G06F 1/1601* (2013.01); *G09F 9/00* (2013.01); *G09F 9/301* (2013.01)

(58) Field of Classification Search
CPC ......... H05K 5/03; G09F 9/301; G09G 3/3225

USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8
See application file for complete search history.

(56) References Cited

U.S. PATENT DOCUMENTS

| | | | |
|---|---|---|---|
| 6,266,123 | B1 | 7/2001 | Maejima et al. |
| 7,868,545 | B2 | 1/2011 | Hioki et al. |
| 8,085,350 | B2 | 12/2011 | Miyazaki et al. |
| 2008/0018631 | A1 | 1/2008 | Hioki et al. |
| 2012/0094568 | A1 | 4/2012 | Miyazaki et al. |
| 2013/0155655 | A1* | 6/2013 | Lee et al. ..................... 362/97.1 |

FOREIGN PATENT DOCUMENTS

| | | |
|---|---|---|
| KR | 101036618 B1 | 5/2011 |
| KR | 101097842 B1 | 12/2011 |
| KR | 1020120052766 A | 5/2012 |

* cited by examiner

*Primary Examiner* — Jerry Wu
(74) *Attorney, Agent, or Firm* — Robert E. Bushnell, Esq.

(57) ABSTRACT

A display device includes a display panel that can be switched to a plane state or a bent state, and the curvature of the display panel can be easily controlled. The display device includes a display panel configured to display an image and a bend control unit located in the rear of the display panel. The bend control unit bends the display panel toward the front of the display panel by pressurizing two regions on the display panel located on different sides based on the center of the display panel.

13 Claims, 5 Drawing Sheets

DISPLAY DEVICE

CLAIM OF PRIORITY

This application makes reference to, incorporates into this specification the entire contents of, and claims all benefits accruing under 35 U.S.C. §119 from an application earlier filed in the Korean Intellectual Property Office on Jan. 14, 2013 and there duly assigned Serial No. 10-2013-0003867.

BACKGROUND OF THE INVENTION

1. Field of the Invention

The present invention relates generally to a display device, and more particularly to a display device including a flexible display panel.

2. Description of the Related Art

A liquid crystal display (LCD) and an organic light emitting diode (OLED) display are known as flat panel displays. Among them, the organic light emitting diode (OLED) display, unlike the liquid crystal display (LCD), can reduce a thickness and weight because it does not need an additional light source and can have a flexible characteristic if pixel circuits and organic light emitting diodes (OLEDs) are formed on a polymer film.

With the development of a display device, sharper image quality and a larger screen size have been able to be implemented in the case of television, and a need for a more stereoscopic screen is increasing in entertainment fields, such as movies and games. To this end, a stereoscopic effect can be applied to an image by implementing a screen having a bent shape.

For example, in the case of a display device having a plane, the entire viewing angle of a person is not satisfied in a large screen. The viewing angle can be satisfied by implementing a screen that is concavely bent. Furthermore, in the case of a concave screen, a more stereoscopic screen can be obtained because the distortion of an image to a viewing angle becomes small.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide a display device in which a display panel can be switched to a plane state or a bent state, and the curvature of the display panel can be easily controlled.

An exemplary embodiment of the invention provides a display device including a display panel configured to display an image and a bend control unit locating in the rear of the display panel. The bend control unit bends the display panel toward a front of the display panel by pressurizing two regions on the display panel located on different sides based on the center of the display panel.

The two regions may be located on the different sides in a first direction parallel to the long side of the display panel, and the display panel may be bent in the first direction. The bend control unit may simultaneously pressurize the two regions in a second direction heading from the rear of the display panel to the front of the display panel.

The bend control unit may include a Y-shaped member, an elastic member, and a movement unit. The Y-shaped member may include three pole units coupled together based on a hinge, and two of the three pole units may be headed for the display panel. The elastic member may be connected to the two pole units, and the movement unit may be combined with the Y-shaped member and configured to move the Y-shaped member forward or backward in the second direction.

Another embodiment of the invention provides a display device, including a display panel and a bend control unit located in the rear of the display panel. The display panel displays an image and includes a first region and a second region located on different sides in a first direction based on the center of the display panel. The bend control unit bends the display panel in the first direction by pressurizing the first region and the second region in a second direction heading for the front of the display panel. The bend control unit includes a pressurization unit configured to simultaneously come into contact with one point on the first region and one point on the second region, and to form a symmetrical shape in the first direction, and a movement unit configured to move the pressurization unit forward or backward in the second direction.

The pressurization unit may include a Y-shaped member configured to include three pole units coupled together based on a hinge, an elastic member connected to two of the three pole units, and roller members combined with the respective ends of the two pole units coupled together by the elastic member.

The Y-shaped member may include i) a first pole unit located at a position furthest from the display panel in response to the center of the display panel and ii) a second pole unit and a third pole unit headed for the display panel, coupled together by the elastic member, configured to have an identical length, and widened at an identical angle to the first pole unit.

A plurality of the Y-shaped members may be included, and the plurality of Y-shaped members may be spaced apart from each other in a third direction crossing the first direction on the display panel.

The display panel may be received in a flexible casing, a rigid post may be fixed to a center of a backside of the flexible casing, and the end of the rigid post may be fixed to a stand. The roller members may come into contact with the flexible casing, and first guide rails parallel to the first direction may be formed in one surface of the flexible casing coming into contact with the roller members.

The display panel may be fixed on a stand, and the movement unit may be installed on the stand in the rear of the display panel. The movement unit may include i) a post combined with the Y-shaped member and ii) a driver combined with the post and configured to move the post forward or backward by using mechanical power.

The movement unit may further include a support for supporting the post, and the driver may include a motor, a rotation screw combined with the motor, and a female thread unit fixed to the support and also engaged with the rotation screw. Second guide rails parallel to the second direction may be formed in the stand and may be configured to guide the forward or backward movement of the support.

A plurality of the Y-shaped members may be included, the plurality of Y-shaped members may be spaced apart from each other on the display panel in a third direction crossing the first direction, and the post may be combined with the plurality of Y-shaped members.

The display device includes the bend control unit disposed in the rear of the display panel. Accordingly, the display panel can be easily switched to a plane state or a bent state, and the curvature of the display panel can also be easily controlled.

Accordingly, the display device can provide a screen having a wider viewing angle and also easily implement a more stereoscopic screen.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown. As those skilled in the art will realize, the described embodiments may be modified in various different ways, all without departing from the spirit or scope of the present invention.

In the specification, when it is said that any part 'includes' or 'comprises' any element, it means the corresponding part may further include another element unless specially described otherwise. Furthermore, in the specification, it will be understood that, when it is said that a part, such as a layer, a film, a region, or a substrate, is 'over' or 'on' another part, it may be directly on another part or a third part may be present between the two parts. Furthermore, the term 'over' or 'on' means that a specific part is placed over or under a target part, but does not necessarily mean that the specific part is placed over the target part on the basis of the gravity direction.

Figure 1:
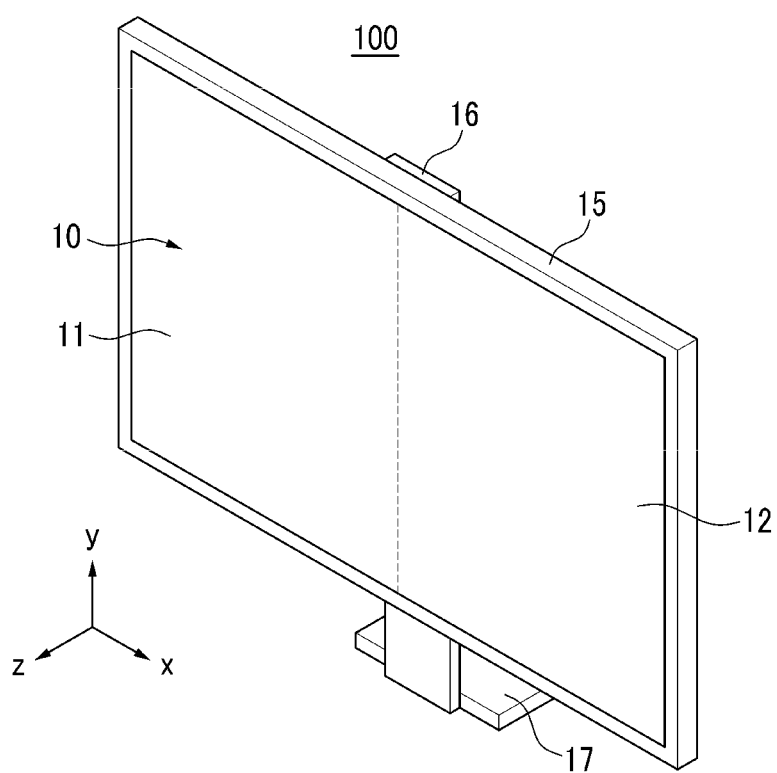
FIG. 1 is a perspective view of a display device in accordance with an exemplary embodiment of the invention.
Figure 2:
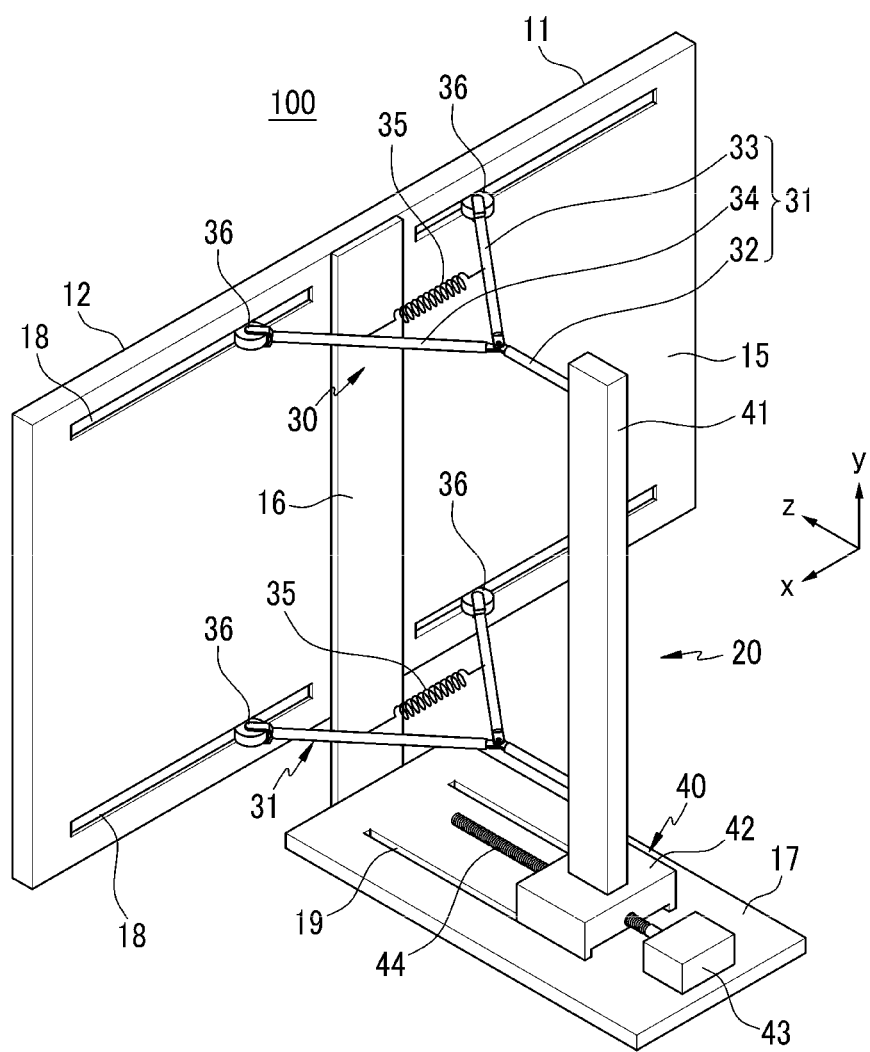
FIG. 2 is a perspective view as seen from the rear of the display device shown in FIG. 1.

FIG. 1 is a perspective view of a display device in accordance with an exemplary embodiment of the invention, and FIG. 2 is a perspective view as seen from the rear of the display device shown in FIG. 1.

Referring to FIGS. 1 and 2, the display device 100 in accordance with the present invention includes a display panel 10 configured to display an image and a bend control unit 20 located in the rear of the display panel 10 and configured to selectively bend the display panel 10.

The display panel 10 is a flexible display panel and can be formed by disposing a plurality of pixels on a polymer film. The display panel 10 can be an organic light emitting display (OLED) panel including a plurality of organic light emitting diodes (OLEDs) or can be a liquid crystal display panel including a liquid crystal layer and a color filter. A flexible display panel is already known in the art, and thus a detailed description thereof is omitted.

The bend control unit 20 bends the display panel 10 toward the front of the display panel 10 by pressurizing two regions (i.e., a first region 11 and a second region 12) on the display panel 10, the two regions being located on respective sides of the center of the display panel 10. A direction in which the display panel 10 is bent is called a first direction, and a direction that heads from the rear of the display panel 10 to the front thereof is called a second direction.

The first region 11 and the second region 12 can be located on opposite sides in a direction parallel to the long side of the display panel 10. In this case, the display panel 10 is bent in a direction parallel to the long side. In contrast, the first region 11 and the second region 12 can be disposed on opposite sides in a direction parallel to the short side of the display panel 10. In this case, the display panel 10 is bent in a direction parallel to the short side.

In FIGS. 1 and 2, the long side of the display panel 10 is illustrated as being parallel to the ground, and the first region 11 and the second region 12 are illustrated as being placed on the left and right sides, respectively, of the display panel 10 so that the display panel 10 is bent in a direction parallel to the long side. The construction of the display device 100 is described below by taking an example in which the first direction (i.e., an x-axis direction) in which the display panel 10 is bent is parallel to the long side of the display panel 10 as an example.

The display panel 10 maintains a plane state when it does not come into contact with the bend control unit 20, but the front (i.e., the display surface) of the display panel 10 is concavely bent in the first direction (i.e., the x-axis direction) when the bend control unit 20 applies force to the first region 11 and the second region 12. When the display panel 10 is bent, a degree (i.e., curvature) to which the display panel 10 is bent is controlled by the strength of the force applied by the bend control unit 20.

The bend control unit 20 pressurizes the first region 11 and the second region 12 by using the same force at the same time so that the display panel 10 is bent while keeping symmetry left and right. Here, one point on the first region 11 and one point on the second region 12 that come into contact with the bend control unit 20 have to maintain the same distance from the center of the display panel 10. To this end, the bend control unit 20 is configured to form a symmetrical shape (i.e., keep symmetry left and right) in the first direction (i.e., the x-axis direction).

More particularly, the display panel 10 can be fixed to a stand 17 by means of a rigid post 16 in a state in which the backside and sides of the display panel 10 have been inserted into a flexible casing 15. The flexible casing 15, together with the display panel 10, is bent by means of the bend control unit 20. The rigid post 16 is parallel to the short side of the display panel 10 at the center of the backside of the flexible casing 15, and the lower part of the rigid post 16 is fixed to the stand 17.

Thus, the central part of the display panel 10 is fixed to the stand 17, and the first region 11 and the second region 12 of the display panel 10 are bent along with the flexible casing 15 by means of the bend control unit 20.

In some embodiments, the flexible casing 15 may be omitted, and the rigid post 16 may be directly attached to the backside of the display panel 10. In this case, the bend control unit 20 directly comes into contact with the backside of the display panel 10 and pressurizes the first region 11 and the second region 12. An example in which the bend control unit 20 comes into contact with the flexible casing 15 is described below.

Figure 3:
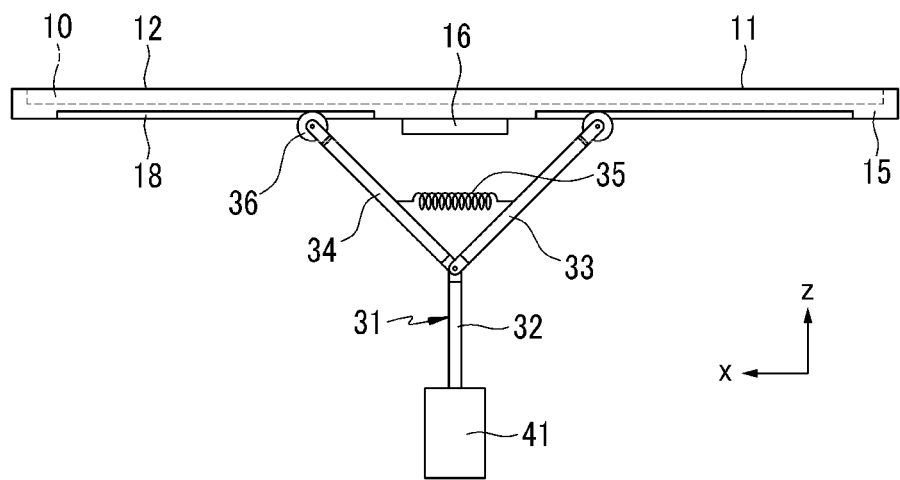
FIG. 3 is a top plan view showing part of the display device shown in FIG. 2.
Figure 4:
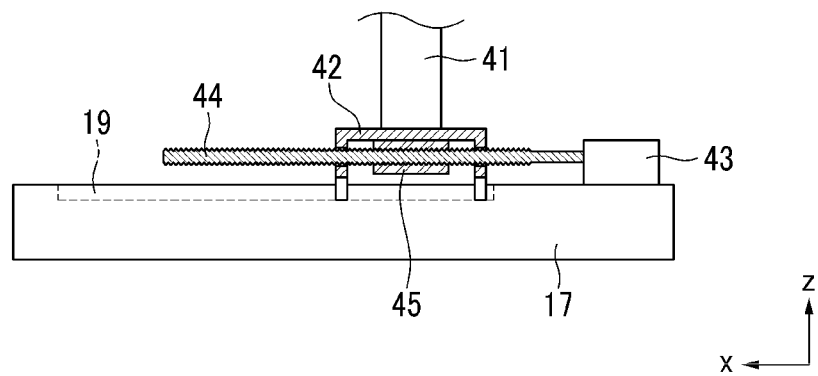
FIG. 4 is a partial cross-sectional view of a bend control unit shown in FIG. 1.

FIG. 3 is a top plan view showing part of the display device shown in FIG. 2, and FIG. 4 is a partial cross-sectional view of the bend control unit shown in FIG. 1.

Referring to FIGS. 2 to 4, the bend control unit 20 includes a pressurization unit 30 configured to come into contact with two points of the flexible casing 15 corresponding to the first region 11 and the second region 12 at the same time, and to form a symmetrical shape (i.e., keep symmetry left and right)

in the first direction (i.e., the x-axis direction), and a movement unit 40 installed on the stand 17 and configured to move the pressurization unit 30 forward or backward in a second direction (i.e., a z-axis direction).

The pressurization unit 30 includes Y-shaped members 31, each configured to include three pole units 32, 33, and 34 coupled together on the basis of a hinge, an elastic member 35 connected to the two pole units 33 and 34 of each Y-shaped member 31 headed for the flexible casing 15, and roller members 36 combined with the respective ends of the two pole units 33 and 34 headed for the flexible casing 15.

The Y-shaped member 31 includes the first pole unit 32, the second pole unit 33, and the third pole unit 34. The first pole unit 32 is located at a position farthest from the display panel 10 in response to the center of the display panel 10. The second pole unit 33 and the third pole unit 34 are headed for the flexible casing 15 and are configured to have the same length and to maintain the same angle relative to the first pole unit 32.

The elastic member 35 can be a spring, and the ends of the elastic member 35 are fixed to the second pole unit 33 and the third pole unit 34, respectively. The roller members 36 are installed at the ends of the second pole unit 33 and the third pole unit 34, and are configured to come into contact with the flexible casing 15. The roller members 36 roll on a surface of the flexible casing 15 when the distance between the second pole unit 33 and the third pole unit 34 widens or narrows on the basis of the first pole unit 32.

The number of Y-shaped members 31 may be one or plural. For example, one Y-shaped member 31 is located relative to the dead center of the display panel 10, and a plurality of Y-shaped members 31 is spaced apart from each other in a third direction (i.e., a y-axis direction) crossing the first direction (i.e., the x-axis direction) on the display panel 10.

In FIG. 2, the pressurization unit 30 is illustrated as including two Y-shaped members 31. The two Y-shaped members 31 may be located at respective upper and lower ends of the display panel 10.

First guide rails 18 for guiding the movement of the roller members 36 can be installed in the backside of the display panel 10 that faces the Y-shaped members 31, that is, in a surface of the flexible casing 15. Each of the first guide rails 18 can be configured to have a concave groove part formed in the flexible casing 15, and each is formed in parallel to the first direction (i.e., the x-axis direction).

The movement unit 40 includes a post 41 combined with the Y-shaped members 31 and placed in parallel to the third direction (i.e., the y-axis direction), and a driver installed on the stand 17 and configured to move the post 41 forward or backward in the second direction (i.e., the z-axis direction). A support 42 for supporting the post 41 is installed on the stand 17. The driver can move the support 42 and the post 41 forward or backward in the second direction (i.e., the z-axis direction) in combination with the support 42.

The driver includes a driving motor 43, a rotation screw 44 combined with the driving motor 43 and rotated when the driving motor 43 is driven, and a female thread unit 45 fixed to the support 42 and engaged with the rotation screw 44. When the rotation screw 44 is rotated by the driving of the driving motor 43, the female thread unit 45, the support 42, and the post 41 move in the second direction (i.e., the z-axis direction).

Here, a direction in which the post 41 moves is controlled by a direction in which the rotation screw 44 is rotated, and the displacement of the post 41 is controlled by the amount of the rotation of the rotation screw 44.

The driver may have a construction using a hydraulic cylinder and a piston or other mechanical constructions other than the aforementioned construction. That is, the driver can include any construction capable of moving the post 41 forward or backward by using mechanical power.

The aforementioned display device 100 can selectively implement a first mode in which the display panel 10 maintains a plane state and a second mode in which the display panel 10 is concavely bent in the first direction. Furthermore, in the second mode, the curvature of the display panel 10 can be controlled in various ways.

In the first mode, the bend control unit 20 can be spaced apart from the flexible casing 15 or the bend control unit 20 can simply come into contact with the flexible casing 15 while not pressurizing the flexible casing 15. In FIGS. 1 to 4, the display device 100 is illustrated as being in the first mode.

Figure 5:
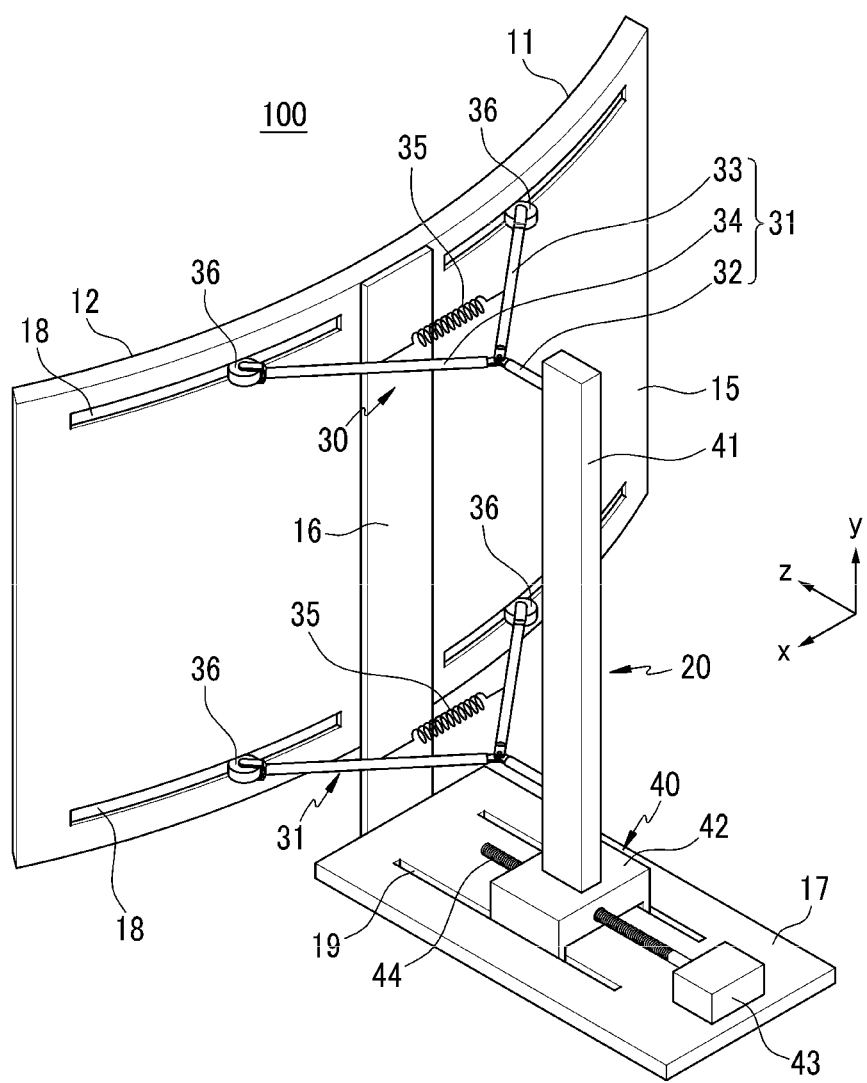
FIG. 5 is a perspective view of the display device showing a state in which a display panel has been bent.
Figure 6:
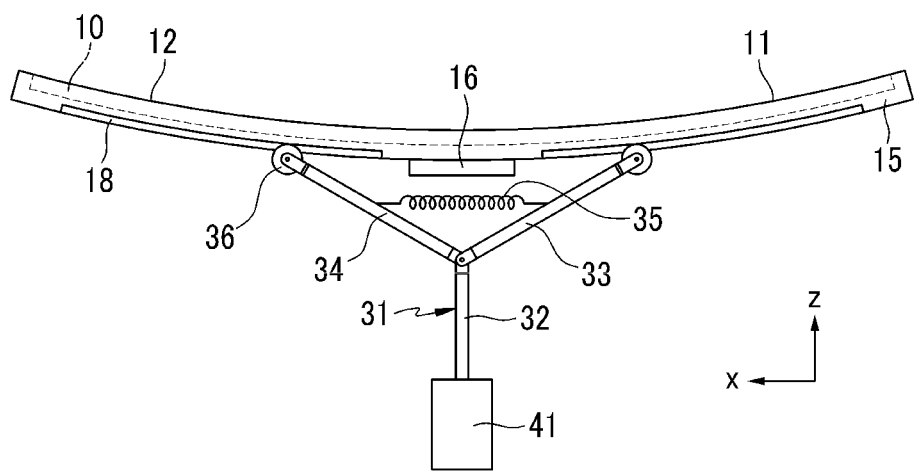
FIG. 6 is a top plan view of the display device showing a state in which the display panel has been bent.

FIGS. 5 and 6 are a perspective view and a top plan view, respectively, of the display device showing a state in which the display panel has been bent, that is, is in a second mode.

Referring to FIGS. 1 to 6, when the rotation screw 44 is rotated in one direction by the driving of the driving motor 43, the female thread unit 45 and the support 42 and the post 41 supporting the female thread unit 45 move forward in the second direction (i.e., the z-axis direction). In response thereto, the Y-shaped members 31 fixed to the post 41 move forward, and thus the distance between the second pole unit 33 and the third pole unit 34 from the first pole unit 32 widens, and the elastic member 35 is extended.

When the distance between the second pole unit 33 and the third pole unit 34 widens, the roller members 36 move to the outside of the display panel 10 in the first guide rails 18, thus pressurizing the flexible casing 15 and the display panel 10 in the second direction (i.e., the z-axis direction). Accordingly, the front (i.e., display surface) of the display panel 10 is concavely bent in the first direction (i.e., the x-axis direction).

As the displacement of the post 41 is increased in this process, the Y-shaped members 31 pressurize the flexible casing 15 and the display panel 10 with greater power in the second direction (i.e., the z-axis direction), thereby being capable of controlling the curvature of the display panel 10.

Here, when the Y-shaped member 31 keeps symmetry left and right, a pair of the roller members 36 are moved in the state in which they are always spaced apart from the center of the display panel 10 by the same distance. Accordingly, the display panel 10 can always keep symmetry left and right on the basis of the center in the second mode.

If the flexible casing 15 is omitted, the first guide rails 18 are provided in the backside of the display panel 10 and the roller members 36 are brought into contact with the backside of the display panel 10. In FIG. 2, reference numeral 19 refer to second guide rails formed in the stand 17 and configured to guide the movement of the support 42. The second guide rails 19 are formed parallel to the second direction (i.e., the z-axis direction).

When the rotation screw 44 of the movement unit 40 is rotated in an opposite direction, the support 42, the post 41, and the Y-shaped member 31 are moved backward and the distance between the second pole unit 33 and the third pole unit 34 narrows by the restoring force of the elastic member 35. Furthermore, the roller members 36 are moved to the inside of the display panel 10 along the first guide rails 18, and thus force applied from the pressurization unit 30 to the display panel 10 is reduced. Accordingly, the degree to which the display panel 10 is bent is reduced, and thus the display panel 10 returns to the plane state.

The operation of the movement unit 40 can be controlled by the manipulation of a user. For example, a button related to the curvature of the display panel 10 can be added to a remote controller (not shown) for controlling the state of the display device 100, and the curvature of the display panel 10 can be controlled by driving the movement unit 40 according to a user's selection.

In the display device 100 of the present invention, the display panel 10 can be easily switched to the plane state or the bent state, and the curvature of the display panel 10 can also be easily controlled because the bend control unit 20 is disposed in the rear of the display panel 10. Accordingly, the display device 100 of the present invention can provide a screen having a wide viewing angle, and can also easily implement a more stereoscopic screen.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a display panel configured to display an image; and
   a bend control unit installed in a rear of the display panel and configured to bend the display panel toward a front of the display panel by pressurizing two regions located on different respective sides of the display panel based on a center of the display panel,
   the bend control unit comprises:
       a Y-shaped member including three pole units coupled together based on a hinge, two of the three pole units being headed for the display panel;
       an elastic member connected to the two pole units; and
       a movement unit combined with the Y-shaped member and configured to selectively move the Y-shaped member forward and backward in a second direction.

2. The display device of claim 1, wherein the two regions are located on the different sides in a first direction parallel to a long side of the display panel, and the display panel is bent in the first direction.

3. The display device of claim 2, wherein the bend control unit simultaneously pressurizes the two regions in the second direction heading from the rear of the display panel to a front of the display panel.

4. A display device, comprising:
   a display panel configured to display an image and including a first region and a second region located on different respective sides of the display panel in a first direction based on a center of the display panel; and
   a bend control unit located in a rear of the display panel, and configured to bend the display panel in the first direction by pressurizing the first region and the second region in a second direction heading for a front of the display panel;
   wherein the bend control unit comprises:
       a pressurization unit configured to simultaneously come into contact with one point on the first region and one point on the second region, and to form a symmetrical shape in the first direction; and
       a movement unit configured to selectively move the pressurization unit forward and backward in the second direction,
   the pressurization unit comprises:
       a Y-shaped member including three pole units coupled together based on a hinge; an elastic member connected to two of the three pole units; and
       roller members combined with respective ends of the two pole units coupled together by the elastic member.

5. The display device of claim 4, wherein the Y-shaped member comprises:
   a first pole unit located at a position farthest from the display panel relative to the center of the display panel; and
   a second pole unit and a third pole unit headed for the display panel, coupled together by the elastic member, configured to have an identical length, and widened at an identical angle to the first pole unit.

6. The display device of claim 4, wherein a plurality of the Y-shaped members is included, and the Y-shaped members are spaced apart from each other in a third direction crossing the first direction on the display panel.

7. The display device of claim 4, wherein the display panel is received in a flexible casing, a rigid post is fixed to a center of a backside of the flexible casing, and an end of the rigid post is fixed to a stand.

8. The display device of claim 7, wherein the roller members come into contact with the flexible casing, and first guide rails parallel to the first direction are formed in one surface of the flexible casing coming into contact with the roller members.

9. The display device of claim 4, wherein the display panel is fixed on a stand, and the movement unit is installed on the stand in the rear of the display panel.

10. The display device of claim 4, wherein the movement unit comprises:
    a post combined with the Y-shaped member; and
    a driver combined with the post and configured to selectively move the post forward and backward by using mechanical power.

11. The display device of claim 10, wherein the movement unit further comprises a support for supporting the post, and wherein the driver comprises a motor, a rotation screw combined with the motor, and a female thread unit fixed to the support and also engaged with the rotation screw.

12. The display device of claim 11, wherein second guide rails parallel to the second direction are formed in the stand and are configured to selectively guide forward and backward movement of the support.

13. The display device of claim 10, wherein a plurality of the Y-shaped members is included, the plurality of Y-shaped members is spaced apart from each other on the display panel in a third direction crossing the first direction, and the post is combined with the plurality of Y-shaped members.

* * * * *